(12) United States Patent
Wang et al.

(10) Patent No.: US 6,872,329 B2
(45) Date of Patent: Mar. 29, 2005

(54) CHEMICAL MECHANICAL POLISHING COMPOSITION AND PROCESS

(75) Inventors: Yuchun Wang, San Jose, CA (US); Rajeev Bajaj, Fremont, CA (US); Fred C. Redeker, Fremont, CA (US); Shijian Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 371 days.

(21) Appl. No.: 09/842,476

(22) Filed: Apr. 25, 2001

(65) Prior Publication Data

US 2002/0031985 A1 Mar. 14, 2002

Related U.S. Application Data

(60) Provisional application No. 60/221,603, filed on Jul. 28, 2000.

(51) Int. Cl.[7] .................. C09K 13/00; C09K 13/04; C09K 13/06; H01L 21/302
(52) U.S. Cl. ........................... 252/79.1; 438/692
(58) Field of Search ................ 525/79.1; 438/692; 252/79.2, 79.4, 79.1

(56) References Cited

U.S. PATENT DOCUMENTS

| 4,465,872 A | 8/1984 | Suzuki et al. ............... 568/803 |
| 4,789,648 A | 12/1988 | Chow et al. ................. 437/225 |
| 4,867,757 A | 9/1989 | Payne .......................... 51/293 |

(Continued)

FOREIGN PATENT DOCUMENTS

| EP | 0 659 858 | 12/1994 | ............ C09G/1/02 |
| EP | 0 846 742 A2 | 6/1998 | ............ C09G/1/02 |
| EP | 0 896 042 | 2/1999 | ............ C09G/1/02 |
| WO | 98/49723 | 11/1998 | ......... H01L/21/321 |
| WO | 99/53532 | 10/1999 | ........... H01L/21/00 |
| WO | 99/61540 | 12/1999 | ............ C09G/1/02 |
| WO | 00/00561 | 1/2000 | ............ C09G/1/02 |
| WO | 00/00567 | 1/2000 | ............ C09K/3/14 |
| WO | 01/12739 | 2/2001 | ............ C09G/1/02 |

OTHER PUBLICATIONS

European Search Report, Oct. 2, 2001.

Austrian Search Report, Sep. 17, 2001.

Gurusamy, et al., "Method and Apparatus for Controlling a Pad Conditioning Process of a Chemical–Mechanical Polishing Apparatus" Feb. 10, 2000. USSN 09/502,560.

Wu, et al., "System and Method for Chemical Mechanical Planarization" May 31, 2000 USSN 09/583,512.

Tobin, et al., "Method and Apparatus for Controlling a Pad Conditioning Process of a Chemical–Mechanical Polishing Apparatus" Mar. 10, 2000 USSN 09/523,363.

*Primary Examiner*—Nadine G. Norton
*Assistant Examiner*—Lynette T. Umez-Eronini
(74) *Attorney, Agent, or Firm*—Townsend & Townsend & Crew

(57) ABSTRACT

A method and composition for planarizing a substrate surface is provided. The polishing composition includes an oxidizer capable of oxidizing a metal undergoing planarization and yielding a complexing agent which complexes with the oxidized metal and a stabilizer such as a stannate salt. The composition may further include abrasive particles and/or inhibitors. The composition may be used in a multi-step polishing process including polishing a substrate surface to selectively remove a metal layer with respect to a barrier layer and dielectric layer and polishing a substrate surface using the composition to non-selectively remove the metal layer, a barrier layer, and a dielectric layer from the substrate surface.

32 Claims, 2 Drawing Sheets

U.S. PATENT DOCUMENTS

| | | | |
|---|---|---|---|
| 5,014,468 A | 5/1991 | Ravipati et al. | 51/295 |
| 5,209,816 A | 5/1993 | Yu et al. | 156/636 |
| 5,340,370 A | 8/1994 | Cadien et al. | 51/308 |
| 5,437,754 A | 8/1995 | Calhoun | 156/231 |
| 5,453,312 A | 9/1995 | Haas et al. | 428/143 |
| 5,454,844 A | 10/1995 | Hibbard et al. | 51/295 |
| 5,692,950 A | 12/1997 | Rutherford et al. | 451/552 |
| 5,693,563 A | 12/1997 | Teong | 437/190 |
| 5,725,417 A | 3/1998 | Robinson | 451/56 |
| 5,738,574 A | 4/1998 | Tolles et al. | 451/288 |
| 5,756,398 A | 5/1998 | Wang et al. | 438/692 |
| 5,782,675 A | 7/1998 | Southwick | 451/56 |
| 5,783,489 A | 7/1998 | Kaufman et al. | 438/692 |
| 5,800,577 A | 9/1998 | Kido | 51/307 |
| 5,804,507 A | 9/1998 | Perlov et al. | 438/692 |
| 5,820,450 A | 10/1998 | Calhoun | 451/530 |
| 5,823,855 A | 10/1998 | Robinson | 451/41 |
| 5,842,910 A | 12/1998 | Krywanczyk et al. | 451/41 |
| 5,866,031 A | 2/1999 | Carpio et al. | 252/79.1 |
| 5,869,392 A * | 2/1999 | Kimura | 438/620 |
| 5,879,226 A | 3/1999 | Robinson | 451/287 |
| 5,916,012 A | 6/1999 | Pant et al. | 451/41 |
| 5,932,486 A | 8/1999 | Cook et al. | 438/692 |
| 5,954,997 A | 9/1999 | Kaufman et al. | 252/79.1 |
| 5,961,372 A | 10/1999 | Shendon | 451/41 |
| 5,990,010 A | 11/1999 | Berman | 438/691 |
| 6,008,405 A | 12/1999 | Gray et al. | 562/3 |
| 6,030,487 A | 2/2000 | Fisher, Jr. et al. | 156/345 |
| 6,030,899 A | 2/2000 | Cook et al. | 438/692 |
| 6,046,110 A | 4/2000 | Hirabayashi et al. | 438/693 |
| 6,063,306 A | 5/2000 | Kaufman et al. | 252/79.4 |
| 6,068,879 A | 5/2000 | Pasch | 427/97 |
| 6,074,949 A | 6/2000 | Schonauer et al. | 438/692 |
| 6,083,840 A | 7/2000 | Mravic et al. | 438/693 |
| 6,096,652 A | 8/2000 | Watts et al. | 438/692 |
| 6,117,775 A | 9/2000 | Kondo et al. | 438/690 |
| 6,117,783 A | 9/2000 | Small et al. | 438/693 |
| 6,126,853 A | 10/2000 | Kaufman et al. | 252/79.1 |
| 6,210,525 B1 | 4/2001 | James et al. | 156/345 |
| 6,217,416 B1 | 4/2001 | Kaufman et al. | 451/41 |
| 6,244,935 B1 | 6/2001 | Birang et al. | 451/41 |
| 6,245,679 B1 | 6/2001 | Cook et al. | 438/692 |
| 6,251,150 B1 | 6/2001 | Small et al. | 51/307 |
| 6,270,395 B1 | 8/2001 | Towery et al. | 451/41 |
| 6,270,396 B1 | 8/2001 | Uchiyama | 451/56 |
| 6,293,848 B1 | 9/2001 | Fang et al. | 451/41 |
| 6,302,766 B1 | 10/2001 | Sethuraman et al. | 451/41 |
| 6,319,096 B1 | 11/2001 | Mueller et al. | 451/41 |
| 6,322,427 B1 | 11/2001 | Li et al. | 451/56 |
| 6,347,981 B1 | 2/2002 | Holzapfel | 451/56 |
| 6,348,076 B1 | 2/2002 | Canaperi et al. | 51/309 |
| 6,361,422 B1 | 3/2002 | Ettinger et al. | 451/339 |
| 6,435,944 B1 | 8/2002 | Wang et al. | 451/41 |
| 6,520,840 B1 * | 2/2003 | Wang et al. | 451/41 |

\* cited by examiner

CHEMICAL MECHANICAL POLISHING COMPOSITION AND PROCESS

CROSS-REFERENCE TO RELATED APPLICATION

This application claims benefit of U.S. provisional patent application Ser. No. 60/221,603, filed Jul. 28, 2000, which is herein incorporated by reference.

BACKGROUND OF THE INVENTION

1. Field of the Invention

The invention generally relates to a composition and method for planarizing materials on a substrate surface.

2. Background of the Related Art

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and now electrochemical plating (ECP).

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Chemical mechanical planarization, or chemical mechanical polishing (CMP), is a common technique used to planarize substrates. CMP utilizes a chemical composition, typically a composition or other fluid medium, for selective removal of material from substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. Thus, the CMP apparatus effects polishing or rubbing movement between the surface of the substrate and the polishing pad while dispersing a polishing composition, or slurry, to effect both chemical activity and mechanical activity and consequential removal of material from the surface of the substrate.

Conventional CMP processes are performed using an abrasive article, such as a polishing composition, or slurry, containing abrasive particles in a reactive solution with a conventional polishing pad. Alternatively, the abrasive article can be a fixed abrasive article, such as a fixed abrasive polishing pad, which may be used with a CMP composition that does not contain abrasive particles. A fixed abrasive article typically comprises a backing sheet with a plurality of geometric abrasive composite elements adhered thereto.

Copper is becoming a metal of choice to form electronic devices on semiconductor substrates. However, copper is difficult to pattern and etch and new processes and techniques, such as damascene or dual damascene processes, are being used to form copper substrate features. In damascene processes, a feature is defined in a dielectric material and subsequently filled with copper. A barrier layer is deposited conformally on the surfaces of the features formed in the dielectric layer prior to deposition of copper material. Copper material is then deposited over the barrier layer and the surrounding field. The copper material deposited on the field is removed by CMP processes to form a copper filled feature in the dielectric material.

Conventionally, in polishing substrates having copper features, the copper material is polished to expose the barrier layer between the copper features, and then the barrier layer is polished to expose the underlying dielectric layer between the copper features. One challenge that is presented in polishing copper materials is that the interface between the conductive material and the barrier layer is generally non-planar. Further, the conductive material and the barrier materials are often removed from the substrate surface at different rates, both of which can result in excess conductive material being retained as residues on the substrate surface. Additionally, the substrate surface may have different surface topography, depending on the density or size of features formed therein, which removes copper material at different removal rates along the substrate surface and makes effective conformal removal of copper material from the substrate surface difficult to achieve.

One solution to removing all of the desired copper material from the substrate surface is overpolishing the substrate surface. However, overpolishing of some materials can result in the formation of topographical defects, such as concavities or depressions in features, referred to as dishing, or excessive removal of dielectric material, referred to as erosion. The topographical defects from dishing and erosion can further lead to non-uniform removal of additional materials, such as barrier layer materials disposed thereunder, and produce a substrate surface having a less than desirable polishing quality. Additionally, chemical compositions used in copper CMP typically include multiple components such as oxidizing agents and complexing agents. The compositions may further include abrasive particles, such as colloidal silica, as the abrasive component. The components are typically combined prior to the delivery of the composition to the pad for polishing. The various components may interact with one another or otherwise degrade resulting in a less effective formulation. A typical pot life, e.g., the effective period of the composition, may be twenty-four (24) hours or less under certain polishing performance requirements.

Therefore, there exists a need for a method that improves planarizing a metal layer, such as a copper layer, on a substrate surface with a polishing composition. There is also a need for polishing compositions having an extended pot life.

SUMMARY OF THE INVENTION

Aspects of the invention generally provide methods and compositions for planarizing a substrate surface including planarizing metals, such as copper and copper alloys, with reduced dishing, improved surface planarity, increased throughput, and reduced manufacturing costs. In one aspect, a composition is provided for polishing a substrate surface, the composition including a reagent having a first moiety for oxidizing the metal and a second moiety for minimizing overetching the metal, and a stannate salt for stabilizing the composition. The composition may further include a base, a corrosion inhibitor, abrasive particles, and combinations thereof.

In another aspect, a composition is provided for polishing a substrate surface, the composition including a reagent having a first moiety including a peroxide group selected from the group of a peroxycarboxylic acid group, a peroxycarboxylate group, and combinations thereof, and a second moiety comprising an alkyl group, an alkyl group derivative, an aryl group, an aryl group derivative, or combinations thereof, and a stannate salt for stabilizing the composition. The composition may further include a base, a corrosion inhibitor, abrasive particles, and combinations thereof.

In another aspect, a method is provided for planarizing a substrate surface including applying a composition to a polishing pad, the composition including a reagent having a first moiety for oxidizing the metal and for complexing with the metal and/or oxidized metal and a second moiety for minimizing overetching of the metal, and a stannate salt for stabilizing the composition, and polishing the substrate surface with the composition. The composition may further include a base, a corrosion inhibitor, abrasive particles, and combinations thereof.

In another aspect, a method is provided for planarizing a substrate surface including polishing a substrate surface using a first composition to selectively remove a metal layer relative to a barrier layer and a dielectric film and polishing a substrate surface using a second composition to non-selectively remove the metal layer, the barrier layer, and the dielectric layer, the second composition including a reagent including a first moiety for oxidizing the metal and for complexing with the metal or oxidized metal and a second moiety for minimizing overetching of the metal, and a stannate salt for stabilizing the composition. The composition may further include a base, a corrosion inhibitor, abrasive particles, and combinations thereof.

BRIEF DESCRIPTION OF THE DRAWINGS

So that the manner in which the above recited aspects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention generally provides a polishing composition which achieves the heretofore elusive objective of effectively planarizing metals, such as copper and copper alloys, at high production throughput while eliminating or substantially reducing dishing, consistent with ever increasing demands for reliable interconnect patterns having feature sizes in the deep submicron range. In addition, the invention enables effective CMP of metals at a reduced manufacturing cost and extended pot life of the composition. As used throughout this disclosure, copper and the symbol Cu is intended to encompass high purity elemental copper as well as copper-based alloys, e.g., copper-based alloys containing at least about 80 wt. % copper.

Chemical mechanical polishing (CMP) is broadly defined herein as polishing a substrate by chemical activity, mechanical activity, or a combination of both chemical and mechanical activity. The mechanical activity is generated by contact between a substrate and a polishing media, such as a polishing pad. Mechanical activity may be enhanced by the use of abrasive particles, either introduced in a polishing composition or disposed in a polishing pad. Chemical activity is generated during a polishing process by reaction between compounds in the polishing composition and the materials on the substrate surface to change the chemical nature of the materials on the substrate surface.

One aspect of the invention will be described below in reference to a planarizing process and composition that can be carried out using chemical mechanical polishing process equipment, such as a Mirra® CMP System available from Applied Materials, Inc., as generally shown and described in U.S. Pat. No. 5,738,574, entitled, "Continuous Processing System for Chemical Mechanical Polishing," the entirety of which is incorporated herein by reference to the extent not inconsistent with the invention. Although, the CMP process and composition is illustrated utilizing the Mirra® CMP System, any system enabling chemical mechanical polishing using the composition described herein can be used to advantage. The following apparatus description is illustrative and should not be construed or interpreted as limiting the scope of the invention.

Figure 1:
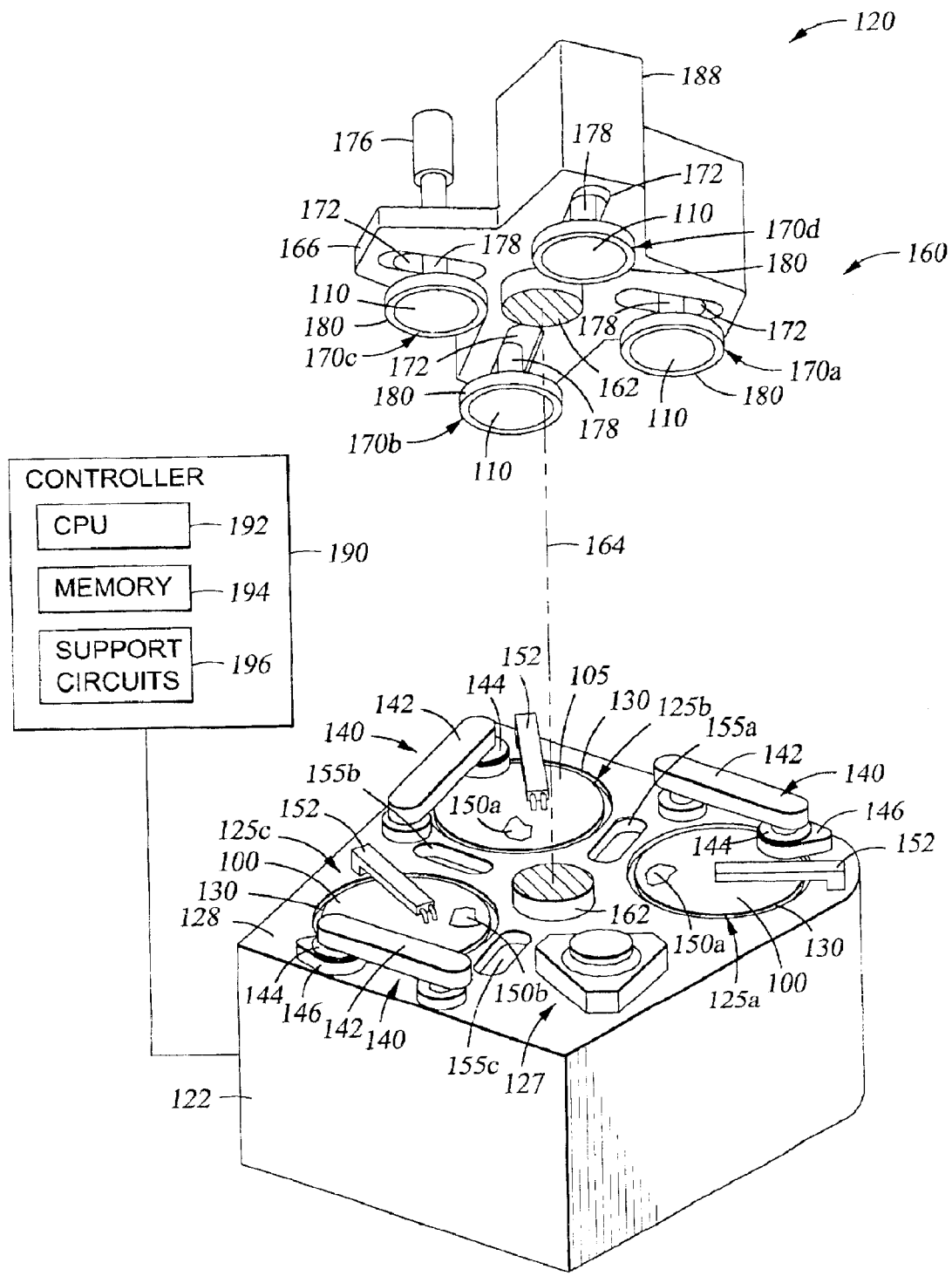
FIG. 1 is a schematic perspective view of a chemical mechanical polishing apparatus.

FIG. 1 is a schematic perspective view of a chemical mechanical polishing system or apparatus 120 for performing the planarizing processes and for use with the CMP compositions described herein. The polishing apparatus 120 includes a lower machine base 122 with a table top 128 mounted thereon and a removable outer cover (not shown). The table top 128 supports a series of polishing stations, including a first polishing station 125a, a second polishing station 125b, a final polishing station 125c, and a transfer station 127. The transfer station 127 serves multiple functions, including, for example, receiving individual substrates 110 from a loading apparatus (not shown), washing the substrates, loading the substrates into carrier heads 180, receiving the substrates 110 from the carrier heads 180, washing the substrates 110 again, and transferring the substrates 110 back to the loading apparatus.

A computer based controller 190 is connected to the polishing system or apparatus 120 for instructing the system to perform one or more processing steps on the system, such as polishing a substrate or transferring a substrate in the polishing apparatus 120. In one embodiment, the invention may be implemented as a computer program-product for use with a computer system or computer based controller 190.

The programs defining the functions of the preferred embodiment can be provided to a computer via a variety of signal-bearing media and/or computer readable media, which include but are not limited to, (i) information permanently stored on non-writable storage media (e.g., read-only memory devices within a computer such as read only CD-ROM disks readable by a CD-ROM or DVD drive), (ii) alterable information stored on a writable storage media (e.g., floppy disks within diskette drive or hard-disk drive); or (iii) information conveyed to a computer by communications medium, such as through a computer or telephone network, including wireless communication. Such signal-bearing media, when carrying computer-readable instructions that direct the functions of the invention, represent alternative embodiments of the present invention. It may also be noted that portions of the product program may be developed and implemented independently, but when combined together are embodiments of the present invention.

Each polishing station 125a–125c includes a rotatable platen 130 having a conventional polishing media 100 or 105 disposed thereon.

The platen may support a conventional polishing pad or "abrasive-free" polishing media 100, i.e., polishing media, such as a polishing pad, that does not have embedded abrasive particles, within a smooth polishing surface or a roughened polishing surface. Polishing pads 100 may be embossed or stamped with a pattern to improve distribution of composition across the face of the substrate. Suitable abrasive-free polishing pads, such as IC-1000 and SUBA-4, for performing the processes described herein are commercially available Rodel Inc., of Phoenix Ariz. (IC-1000 and SUBA-4 are product names of Rodel, Inc.).

A rotatable linear platen may be used for one or more of the polishing station 125. An example of a polishing system having a rotatable polishing pad and a rotatable linear platen, is more fully described in co-pending U.S. patent application Ser. No. 09/244,456, filed on Feb. 4, 1999, and incorporated herein by reference to the extent not inconsistent with the invention. A stationary platen, a rotatable platen, a liner platen, or a linear rotatable platen may be used for the first, second, or third, polishing stations 125a, 125b, and 125c.

Aspects of the invention also contemplate the use of an orbital polishing process or orbital polishing platen for the first, second, and/or third polishing stations 125a, 125b, 125c. A substrate and polishing pad can be moved in an orbital relative motion in a linear drive system where the pad is stationary; an example of a apparatus capable of performing the orbital relative motion between the polishing pad and substrate is the Model 8200, available from Applied Materials Inc., of Santa Clara, Calif.

Each platen 130 may be a rotatable aluminum or stainless steel platen connected to a platen drive motor (not shown). The polishing stations 125a–125c may include a pad conditioner apparatus 140. The pad conditioner apparatus 140 has a rotatable arm 142 holding an independently rotating conditioner head 144 and an associated washing basin 146. The pad conditioner apparatus 140 maintains the condition of the polishing pad so that it will effectively polish the substrates. Each polishing station may include a conditioning station if the CMP apparatus is used with other pad configurations.

The polishing stations 125a–125c may each have a composition delivery/rinse arm 152 that includes two or more supply tubes to provide one or more CMP compositions, cleaning compositions, and/or water to the surface of the polishing pad. The composition delivery/rinse arm 152 delivers the one or more chemical compositions in amounts sufficient to cover and wet the entire polishing pad. Each composition delivery/rinse arm 152 also includes several spray nozzles (not shown) that can provide a high-pressure fluid rinse on to the polishing pad at the end of each polishing and conditioning cycle. Furthermore, two or more intermediate washing stations 155a, 155b, and 155c may be positioned between adjacent polishing stations 125a, 125b, and 125c to clean the substrate as it passes from one station to the next.

A rotatable multi-head carousel 160 is positioned above the lower machine base 122. The carousel 160 includes four carrier head systems 170a, 170b, 170c, and 170d. Three of the carrier head systems receive or hold the substrates 110 by pressing them against the polishing pads 100 or 105 disposed on the polishing stations 125a–125c. One of the carrier head systems 170a–170d receives a substrate from and delivers a substrate 110 to the transfer station 127. The carousel 160 is supported by a center post 162 and is rotated about a carousel axis 164 by a motor assembly (not shown) located within the machine base 122. The center post 162 also supports a carousel support plate 166 and a cover 188.

The four carrier head systems 170a–170d are mounted on the carousel support plate 166 at equal angular intervals about the carousel axis 164. The center post 162 allows the carousel motor to rotate the carousel support plate 166 and orbit the carrier head systems 170a–170d about the carousel axis 164. Each carrier head system 170a–170d includes one carrier head 180. A carrier drive shaft 178 connects a carrier head rotation motor 176 (shown by the removal of one quarter of the cover 188) to the carrier head 180 so that the carrier head 180 can independently rotate about its own axis. There is one carrier drive shaft 178 and motor 176 for each head 180. In addition, each carrier head 180 independently oscillates laterally in a radial slot 172 formed in the carousel support plate 166.

The carrier head 180 performs several mechanical functions. Generally, the carrier head 180 holds the substrate 110 against the polishing pads 100 or 105, evenly distributes a downward pressure across the back surface of the substrate 110, transfers torque from the drive shaft 178 to the substrate 110, and ensures that the substrate 110 does not slip out from beneath the carrier head 80 during polishing operations.

Figure 2:
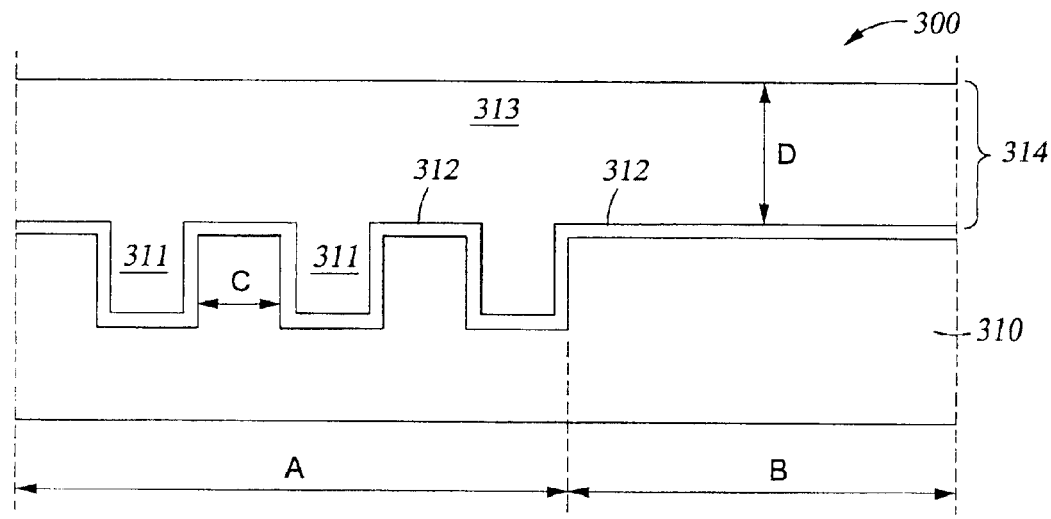
FIGS. 2–4 are schematic diagrams of a substrate illustrating one embodiment of a process for planarizing a substrate surface using a polishing composition described herein.

To facilitate control of the system as described above, the controller 190 may include a CPU 192 of FIG. 2, which CPU 192 may be one of any form of computer processors that can be used in an industrial setting for controlling various chambers and subprocessors. The memory 194 is coupled to the CPU 192. The memory 194, or computer-readable medium, may be one or more of readily available memory such as random access memory (RAM), read only memory (ROM), floppy disk, hard disk, or any other form of digital storage, local or remote. For storing information and instructions to be executed by the CPU 192.

The support circuits 196 are coupled to the CPU 192 for supporting the processor in a conventional manner. These circuits include cache, power supplies, clock circuits, input/output circuitry and subsystems, and can include input devices used with the controller 190, such as keyboards, trackballs, a mouse, and display devices, such as computer monitors, printers, and plotters. Such controllers 190 are commonly known as personal computers; however, the present invention is not limited to personal computers and can be implemented on workstations, minicomputers, mainframes, and supercomputers.

A process, for example a polishing process described below, is generally stored in the memory 194, typically as a software routine. The software routine may also be stored and/or executed by a second CPU (not shown) that is remotely located from the hardware being controlled by the CPU 192.

Although the process of the present invention is discussed as being implemented as a software routine, some or all of the method steps that are disclosed therein may be performed in hardware as well as by the software controller. As such, aspects of the invention may be implemented in software as executed on a computer system, in hardware as an application specific integrated circuit or other type of hardware implementation, or a combination of software and hardware.

Polishing Processes and Compositions

The words and phrases used herein should be given their ordinary and customary meaning in the art by one skilled in the art unless otherwise further defined. Pot life should be broadly construed and includes, but is not limited to, the storage time of a chemical composition to provide effective chemical activity at desired polishing performance requirements before degradation of the chemical composition to insufficient chemical activity. Moiety should be broadly construed and includes, but is not limited to, a portion or sub-component of a compound or solution. Stabilizer should be broadly construed and includes, but is not limited to, a substance that tends to keep a compound, mixture, or solution from changing its form or chemical nature. Selectively, or selectivity, should be broadly construed and includes, but is not limited to, removing a material at a higher removal rate than an adjacent material, for example, selectively removing a metal layer disposed on a barrier layer involves removing the metal layer at a higher removal rate than the barrier layer. Non-selectively, or non-selectivity, should be broadly construed and includes, but is not limited to, removing adjacent materials at similar or same removal rates, for example removing a metal layer and a barrier layer at a removal rate ratio of metal layer to barrier layer of about 10:1 or less is considered non-selectivity removal of materials described herein.

Aspects of the invention are achieved by employing a composition for polishing conductive materials, such as copper, barrier materials, such as tantalum, and dielectric materials, such as silicon oxide or carbon-doped silicon oxide on conventional polishing media or fixed abrasive polishing media. In accordance with embodiments of the invention, a reagent is incorporated in the composition which functions not only as an oxidizer for metals but also complexes with any oxidized metals, thereby preventing overetching, and enhancing the removal rate of metals by solubilizing the oxidized metal. A stabilizer is also incorporated in the composition to increase the pot life of the composition.

Embodiments of reagents that can be employed or formulated to implement the oxidizing and complexing functions for use in a polishing composition include an organic reagent that contains a first moiety and a second moiety. The first moiety oxidizes a metal on a substrate surface, such as copper, and may then complexes with the metal or oxidized metal. The second moiety prevents overetching of the metal and may include a complexing group. Typically, the first moiety includes a hydrophilic compound or group, such as a peroxide group, and the second moiety includes a hydrophobic compound and group, such as an alkyl or aryl group.

In one embodiment, the first moiety, the oxidizing moiety, includes a peroxide group, such as a peroxycarboxylic acid group or a peroxycarboxylate group for oxidizing a metal. The peroxycarboxylic acid group may include a peroxyacetic acid, peroxybenzoic acid, chlorobenzoic acid, peroxyformic acid, polyethylene glycol peroxy acid, or combinations thereof, and peroxycarboxylate group can be metal salts of the peroxycarboxylic acid group. A carboxylic acid or carboxylate derivative formed from the peroxide group is a complexing agent which forms complexes with the metal, metals ions, and the metal oxide for removal from the substrate surface. The second moiety includes an alkyl group or derivative thereof, such as a polyethylene glycol, or an aryl group, such as benzene or a derivative thereof. The second moiety may also perform as a complexing agent with the metal, metals ions, and the metal oxide during the polishing process.

Examples of reagents including both the first and the second moieties can include peroxybenzoic acid, chlorobenzoic acid, peroxyacetic acid and peroxyformic acid. Other organic peroxides such as benzoyl peroxide can also be used as an oxidizing and complexing reagent. In addition, suitable reagents include polyethylene glycol peroxy acids, such as $HO_3C(CH_2CH_2O)_nCO_3H$, where n is between about 10 and about 100. The polyethylene glycol peroxy acids may be synthesized from polyethylene glycol.

Reagents that implement the oxidizing and complexing functions may also include chemical compounds that dissociate upon formulating the composition into an oxidizer and a complexing agent, and include any of various amine-peroxy acids, such as urea hydrogen peroxide.

The reagent that implement the oxidizing and complexing functions may comprise between about 0.005 wt. % and about 25 wt. % of the composition. In one aspect of the composition, between about 0.005 wt. % and about 5 wt. % of the reagent may be used in the composition. The reagent may comprise between about 0.005 wt. % and about 1.0 wt. % of the composition. Increasing the concentration of the reagent has been observed to enhance the removal rate of copper.

The stabilizer may comprise a stannate salt or a mixture of stannate salts, such as soluble sodium stannate, potassium stannate, ammonium stannate, and combinations thereof. Other tin based salts that increase the pot-life of the polishing composition are also contemplated by the invention. In one aspect of the composition, sodium stannate or potassium stannate is employed as the source of tin. Alternatively, the stabilizer may also comprise a radical scavenger, such as butylated hydroxytoluene (BHT) or hydroquinone.

The stannate salt can be present in an amount of between about 0.1 parts per million (ppm) and about 20 ppm. It has been observed that using a stannate stabilizer increases the pot-life of a polishing composition from less than twenty (24) hours without the stabilizer to over 30 days with the stabilizer.

An inorganic solvent such as deionized water, or an organic solvent, such as oil or alcohol, is used with the reagent and stabilizer to form a solution of the composition.

The composition may further include a pH-adjusting agent, such as a base, to increase the solubility of a reagent if necessary, as when employing a higher molecular weight aliphatic or aromatic carboxylic acid component. Higher molecular weight aliphatic or aromatic carboxylic acid components include carboxylic acid components of the reagent which contain more than about 7 carbon atoms. Examples of pH adjusting agents include ammonium hydroxide or potassium hydroxide. The amount of the pH-adjusting agents, particularly bases, is adjusted in order to form a salt of the reagent. For example, a base can be present in a molar ratio with respect to the reagent in a range of base to reagent of between about 1:1 and about 1:2. The amount of pH adjusting agent may be used in the composition to adjust the composition to have a pH of about neutral. For example, a base provides a pH between about 7 and about 8 in at least one embodiment of the composition.

The composition may also include a corrosion inhibitor. Suitable corrosion inhibitors include cyclic nitrogen compounds, such as those containing one or more azole groups. Examples of corrosion inhibitors include benzotriazole (BTA), mercaptobenzotriazole, 5-methyl-1- benzotriazole, imidazole, benzimidazole, benzothiazole, and combinations thereof. Derivatives of cyclic nitrogen compounds substituted with hydroxy, amino, imino, carboxy, mercapto, nitro, alkyl groups, and combinations thereof, may also be used as corrosion inhibitors in the composition. The corrosion inhibitors can be present in an amount between about 0.005 wt. % and about 1.0 wt. % of the polishing composition. The corrosion inhibitor comprises between about 0.01 wt. % and about 0.04 wt. % of the composition.

Alternatively, abrasive particles may be added to the composition to further improve or enhance the polishing rate of the composition. Suitable abrasive particles include alumina, titania, zirconia, germania, silica, ceria and mixtures thereof. Abrasive particles may comprise between about 0.01 wt. % and about 30 wt. % of the composition. Abrasive particles can be stored and delivered separately or can be combined with the other reagents prior to application to a substrate surface.

Suitable amounts of reagents and additional components can be determined and optimized in a given situation in accordance with teachings therein. Generally, aspects of the invention are applicable for CMP of various metals, such as aluminum, copper, titanium, tantalum, nitrides thereof, as well as dielectric materials, including silicon oxide, silicon oxynitride, and low dielectric constant materials, such as carbon doped silicon oxide. The invention contemplates the use of additional components, such as surfactants, which can be incorporated into aspects of the composition to modify or control the polishing rate and selectivity of the composition with respect to metal layers, barrier layers, and dielectric layers.

An example of a polishing composition described herein includes between about 0.005 wt. % and about 25 wt. % of the reagent, such as peroxyacetic acid, and the stannate salt, such as sodium stannate, in an amount of between about 0.1 and about 20 ppm, with the remainder of the composition being deionized water or alcohol. A corrosion inhibitor, such as 5-methyl benzotriazole or benzotriazole, may be included in an amount of between about 0.005 wt. % and about 0.5 wt. % of the composition, and abrasive particles, such as alumina or silica, may be employed in the composition in an amount between about 0.01 wt. % and about 30 wt. %.

A further example of the composition containing the reagent described herein comprises between about 0.01 wt. % and about 0.1 wt. % of peracetic acid, between about 0.05 wt. % and about 0.3 wt. % of benzotriazole, between about 5 wt. % and about 20 wt. % abrasives, between about 0.1 and about 20 ppm of sodium stannate, and potassium hydroxide in a sufficient amount to provide a pH between about 7 and about 8.

The precise mechanism underpinning the manner on which the reagents function is not known with certainty. However, it is believed that the organic reagent employed as an oxidizer generates a complexing agent upon oxidation of a metal. For example, it is believed that the peroxide group in the hydrophilic group of the reagent oxidizes the metal surface. The resulting derivative, an organic acid by-product, is believed to react with the metal or oxidized metal, e.g., copper or the oxidized copper ($Cu^{2+}$), to form an organic acid complex. Further, it is believed that the dishing is significantly curtailed because the reagent molecule has reduced or minimal diffusion and chemical activity with material disposed under the metal surface, such as barrier material at a copper and barrier layer interface, due to the hydrophobic group of the reagent. Thus, the thickness of the oxide layer is controlled and dishing reduced.

Aspects of the invention provide additional advantages over conventional CMP compositions in that the single compound provides both oxidizing and complexing reagents and exhibits greater stability than hydrogen peroxide-containing formulations which exhibit a limited pot life. Further, the use of a single compound oxidizing-complexing reagent reduces the number of separate chemicals involved in polishing solutions by avoiding separate or multiple oxidizing agents and complexing agents, as found in some conventional polishing compositions. Reagents that dissociate upon formulating the composition into an oxidizer and a complexing agent also reduce the number of separate chemicals required for formulating the composition and, additionally, increase the shelf life of the oxidizing component. The use of a composition containing such a reagent creates reaction chemistry in situ for metal CMP.

Moreover, the use of the stannate salt has been demonstrated to improve the pot life significantly. While the precise mechanism underpinning the manner in which the stabilizer improves pot life is not known with certainty, it is believed that the stabilizer prevents decomposition, by a reduction mechanism, of the reagent that implement the oxidizing and complexing functions. Premature oxidation in the reagent is believed to occur by catalyzation of the reagent by trace metal ion contamination, such as by copper, iron, magnesium, or calcium ions, present in the composition. The stabilizer exhibits an affinity to these trace metals to form complexes or other compounds, thereby preventing the ability of the trace metals to catalyze decomposition of the reagent.

In accordance with embodiments of the invention, a copper containing material is effectively planarized with no or substantially reduced dishing, thereby enabling the use of conventional photolithography to form metal features having dimensions in the submicron range. A typical copper metallization or interconnect system comprises, but is not limited to, interconnects, such as damascene features.

Figure 3:
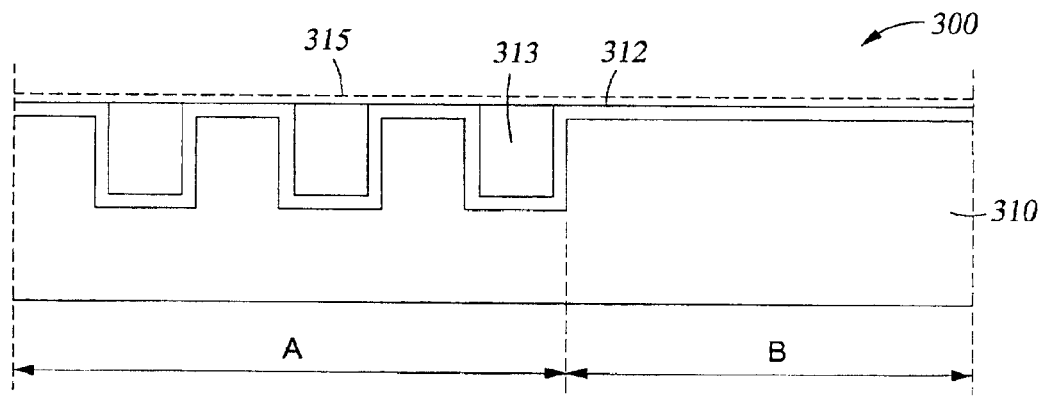
Figure 4:
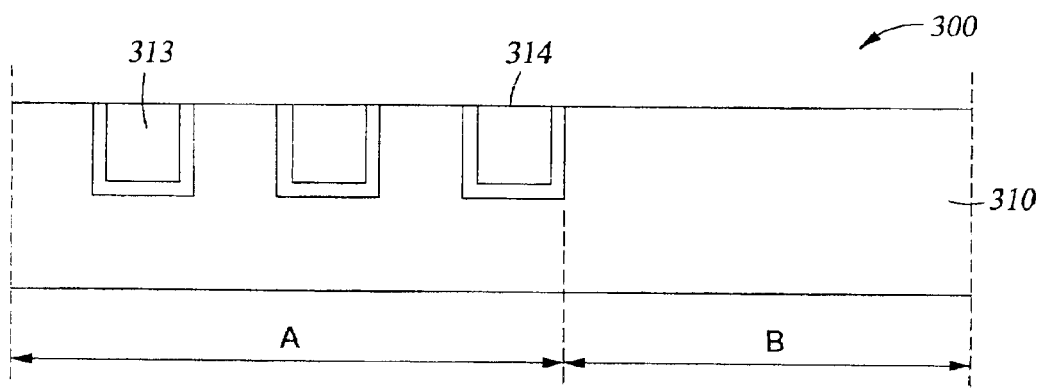

FIGS. 2–4 are a series of schematic cross-sectional views of a substrate illustrating sequential phases of a process for forming an in-laid metallization pattern utilizing the composition described herein. One embodiment of the process includes polishing a substrate surface using a first composition that selectively removes a metal layer relative to a barrier layer and a dielectric layer and polishing a substrate surface using a second composition that non-selectively removes the metal layer, the barrier layer, and the dielectric layer. The second composition comprising a reagent comprising a first moiety for oxidizing the metal and for complexing with the metal or oxidized metal and a second moiety for minimizing overetching the metal, and a stannate salt for stabilizing the composition.

Referring to FIG. 2, the substrate includes a dielectric layer 310, such as a silicon oxide or a carbon-doped silicon oxide, formed on a substrate 300. A plurality of openings 311 patterned and etched into the dielectric in area A forming features for a dense array of conductive lines with area B being unetched. Typically, the openings 311 are spaced apart by a distance C which can be less than about 1 micron, such as about 0.2 micron, or greater than 10 microns, such as 20 microns. The openings 311 were formed in the dielectric layer 310 by conventional photolithographic and etching techniques.

The dielectric layer 310 can comprise any of various dielectric materials conventionally employed in the manufacture of semiconductor devices. For example, dielectric materials, such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD) can be employed. The dielectric layer can also comprise low dielectric constant materials (i.e., dielectric material having a dielectric constant of about 3 or less), including fluoro-silicon glass (FSG), polymers, such as polymides, and carbon-containing silicon dioxide.

A barrier layer 312 of a conductive material is disposed conformally in openings 311 and on the upper surface of the dielectric layer 310. The barrier layer material includes tantalum, tantalum nitride, tantalum silicon nitride. Aspects of the invention described herein also contemplate the use of other barrier materials known in the art, such as titanium, titanium nitride, tantalum derivatives, and titanium silicon nitride, titanium derivatives, and other conventional barrier materials.

A copper containing material 313 is disposed on the barrier layer at a thickness (D) between about 8,000 Å and about 18,000 Å. Advantageously, the copper containing material is deposited by initially depositing a seedlayer and then electroplating or electroless plating the copper material to fill the feature. Copper may also be deposited by physical vapor deposition at a temperature of about 50° C. and/or by chemical vapor deposition at a temperature under about 200° C.

The copper containing material includes copper, copper alloys, or doped copper. As used throughout this disclosure, the phrase "copper containing material" and the symbol Cu are intended to encompass high purity elemental copper as well as doped copper and copper-based alloys, e.g., doped copper and copper-based alloys containing at least about 80 wt. % copper.

Referring to FIG. 3, excess copper material 314 of the copper containing layer 313 is removed using a first polishing composition in a first polishing process. The first polishing composition is selective to the removal of copper, such that the copper containing material 313 is removed at a higher rate than the underlying tantalum barrier layer 312 material. The first polishing composition removes the copper containing layer 313 to the tantalum barrier layer 312. An example of an abrasive-free first polishing composition described herein includes HS-C430-A3 commercially available from Hitachi Chemical Co., of Japan. Residual copper containing material 315 may remain on the substrate following removal of the excess copper containing material.

Referring to FIG. 4, the residual copper containing material 315, the tantalum barrier layer 312, and a portion of the dielectric material 310 are removed by a second polishing process using a reagent containing composition described herein to minimize dishing of the copper later 313, and minimize formation of a non-planar surface. The conditions of the second polishing process non-selectively removes the residual copper containing material 315, the tantalum barrier layer 312, and a portion of the dielectric material 310. As used herein, non-selective polishing means that the removal rate of barrier materials, such as tantalum, relative to conductive materials, such as copper, is not greater than about 10:1, and the removal rate of dielectric materials, such as low k dielectric materials, relative to conductive materials, such as copper, is not greater than about 5:1. Additionally, the dielectric layer 310 may be polished or buffed during the barrier layer CMP process to remove or reduce scratching or defects formed on the substrate surface. The resulting copper features comprises a dense array (A) of copper lines 313 bordered by open field B and the planar surface 314 of the copper metallization and substrate 300.

Aspects of the invention provide a polishing composition for planarizing metals, such as copper at a high removal rate, e.g., greater than 5,000 Å per minute with reduced dishing, thereby enabling an improvement in the speed of the resulting integrated circuit and yield. Embodiments of the invention, therefore, enable semiconductor devices to be fabricated which have enhanced cross-sectional area of copper interconnects, thereby improving electrical performance by reducing interconnect resistance. Embodiments of the compositions of the invention exhibit controllable selectivity between copper, barrier layer materials, and dielectric material, thereby rendering them particularly applicable to damascene techniques. Embodiments of compositions of the invention enable a reduction in the amount of chemicals employed in a composition, thereby reducing manufacturing costs and simplifying processing. The compositions in accordance with embodiments of the invention exhibit significantly greater stability than hydrogen peroxide-containing compositions that have a limited shelf life.

Aspects of the invention are applicable to planarizing during various stages of semiconductor manufacturing and enjoy particular applicability in the manufacture of high density semiconductor devices with metal features in the deep submicron range.

EXAMPLES

Embodiments of the polishing compositions described herein were used to planarize copper, tantalum, carbon containing silicon oxide dielectric materials, such as Black Diamond™ dielectric layer, and silicon oxide dielectric materials formed using tetraethyl orthosilicate (TEOS) disposed on a substrate surface. Black Diamond™ dielectric layer is a low dielectric constant dielectric material commercially available from Applied Materials, of Santa Clara, Calif. The objective was to obtain a copper removal rate of between about 400 and about 1000 Å/min, a tantalum removal rate between about 1000 and about 2000 Å/min, a Black Diamond™ dielectric layer removal rate of between about 500 and about 3000 Å/min, and a TEOS dielectric layer removal rate of about 1000 Å/min.

CMP compositions containing a chemical solution of reagent solution to abrasives of about 2:1 were formed as follows. The reagent solution includes 0.02 wt. % peroxyacetic acid, 10 PPM sodium stannate, and 0.01 wt. % BTA, and the abrasives includes 30 wt. % Rodel 3400 MA colloidal silica at pH 10-11. The composition was then used to polish a substrate surface at a polishing pad pressure of 3 psi and polishing speed of 103 rpm, the removal rates shown below in TABLE 1 were obtained.

TABLE I

| MATERIAL REMOVED | REMOVAL RATE (Å/min) |
|---|---|
| Copper | Approximately 300–600 |
| Tantalum | Approximately 1000 |
| Black Diamond ™ dielectric layer | Approximately 1200–1500 |
| TEOS dielectric layer | Approximately 900–1000 |

The results of TABLE 1 should be compared with an observed CMP removal rate of Black Diamond™ dielectric layer by abrasive containing solutions of about 4500 (Å/min).

CMP compositions containing a chemical solution of reagent solution to abrasives of about 1:1 were formed as follows. The reagent solution includes 0.02 wt. % peroxyacetic acid, 10 PPM sodium stannate, and 0.01 wt. % BTA, and the abrasives includes 30 wt. % Rodel 3400 MA colloidal silica at pH 10-11. The composition was then used to polish the substrate surface at a polishing pad pressure of 3 psi and polishing speed of 103 rpm, the removal rates shown in TABLE 2 were obtained.

TABLE 2

| MATERIAL REMOVED | REMOVAL RATE (Å/min) |
| --- | --- |
| Copper | Approximately 687 |
| Black Diamond ™ dielectric layer | Approximately 1144 |
| TEOS dielectric layer | Approximately 1122 |

The results of TABLE 2 should be compared with the following observed removal rates during polishing with abrasive only polishing solutions, such as 324 Å/min for copper, 2733 Å/min for Black Diamond™ dielectric layer, and 1998 Å/min for TEOS dielectric layer.

The results of TABLES 1 and 2 show that CMP compositions described herein remove metal, conventional dielectric materials, and low-k dielectric materials, at relatively similar polishing rates. Removal rates of tantalum relative to copper of 10:1 or less, and removal rates of low-k dielectric relative to copper of 5:1 or less have been observed using aspects on the composition described herein. By contrast, CMP compositions utilizing abrasive alone without the peroxycarboxylic acid component, performed relatively selective polishing of the dielectric material, i.e., a removal rate of dielectric material relative to metal layer of greater than about 10:1.

The stabilizer component is illustrated in conjunction with another set of experimental results. In this third experiment, a CMP composition was prepared as described above in connection with TABLE 1, but without the stabilizer component. As shown in TABLE 1, immediately following preparing of the composition, the copper removal rate was about 600 Å/min. Following a period of storage of about 24 hours, the same composition was used in an identical polishing process and removed copper at only approximately 250 Å/min, or about the same rate of removal utilizing a composition containing abrasive alone. By contrast, the CMP composition including the sodium stannate stabilizer component exhibited little or no decline in copper removal rate the following day or even three weeks later.

While foregoing is directed to the preferred embodiment of the invention, other and further embodiments of the invention may be devised without departing from the basic scope thereof, and the scope thereof is determined by the claims that follow.

What is claimed is:

1. A composition for polishing a metal, the composition comprising:
    a reagent comprising:
        a first moiety for oxidizing the metal; and
        a second moiety for minimizing overetching the metal;
    a stannate salt for stabilizing the composition;
    a corrosion inhibitor; and
    a base.

2. The composition according to claim 1, wherein the first moiety is reduced to a complexing agent for the metal or oxidized metal.

3. The composition according to claim 2, wherein the first moiety comprises a peroxide group selected from the group consisting of a peroxycarboxylic acid group, a peroxycarboxylate group, and combinations thereof, and the resulting complexing agent comprises a carboxylic acid or a carboxylate.

4. The composition according to claim 1, wherein the second moiety comprises an alkyl group, an alkyl group derivative, an aryl group, an aryl group derivative, or combinations thereof.

5. The composition according to claim 4, wherein the second moiety is selected from the group consisting of polyethylene glycol, polyethylene glycol derivatives, benzene, benzene derivatives, and combinations thereof.

6. The composition according to claim 1, wherein the reagent comprises between about 0.005 wt. % and about 25 wt. % of the composition.

7. The composition according to claim 1, wherein the stannate salt comprises between about 0.1 ppm and about 20 ppm of the composition.

8. The composition according to claim 1, wherein the stannate salt is selected from the group consisting of sodium stannate, potassium stannate, ammonium stannate, and combinations thereof.

9. The composition according to claim 1, wherein the base is provided in a sufficient amount to increase the solubility of the resulting complexing agent by forming a salt thereof.

10. The composition according to claim 9, wherein the base comprises ammonium hydroxide or potassium hydroxide.

11. The composition according to claim 1, wherein the composition has a pH of about 7.

12. The composition according to claim 1, wherein the corrosion inhibitor is selected from the group consisting of benzotriazole, imidazole, benzimidazole, benzothiazole, mercaptobenzotriazole, 5-methyl-1-benzotriazole, and combinations thereof.

13. The composition according to claim 1, wherein the corrosion inhibitor comprises between about 0.005 wt. % and about 0.05 wt. % of the composition.

14. The composition according to claim 1, further comprising abrasive particles at a concentration between about 0.1 wt. % and about 30 wt. % of the composition.

15. The composition according to claim 3, wherein the peroxycarboxylic acid group is selected from the group consisting of peroxyacetic acid, peroxybenzoic acid, chlorobenzoic acid, peroxyformic acid, polyethylene glycol peroxy acid, and combinations thereof.

16. The composition according to claim 1, wherein the reagent comprises an amine-peroxy acid.

17. A composition for polishing a metal, the composition comprising:
    a reagent comprising:
        a first moiety comprising a peroxide group selected from the group consisting of a peroxycarboxylic acid group, a peroxycarboxylate group, and combinations thereof; and
        a second moiety comprising an alkyl group, an alkyl group derivative, an aryl group, an aryl group derivative, or combinations thereof;
    a stannate salt;
    a corrosion inhibitor; and
    a base.

18. The composition according to claim 17, wherein the peroxide group reduces to form a complexing agent comprising a carboxylic acid, a carboxylate, or combinations thereof.

19. The composition according to claim 17, wherein the reagent comprises between about 0.005 wt. % and about 25 wt. % of the composition.

20. The composition according to claim 17, wherein the stannate salt comprises between about 0.1 ppm and about 20 ppm of the composition, and wherein the stannate salt is selected from the group consisting of sodium stannate, potassium stannate, ammonium stannate, and combinations thereof.

21. The composition according to claim 17, further comprising abrasive particles.

22. The composition according to claim 17, wherein the reagent comprises an amine-peroxy acid.

23. A composition for polishing a metal, the composition comprising:
   a reagent comprising:
      a first moiety for oxidizing the metal; and
      a second moiety for minimizing overetching the metal;
   a stannate salt for stabilizing the composition; and
   a base to adjust the pH to about 7.

24. The composition according to claim 23, wherein the first moiety is reduced to a complexing agent for the metal or oxidized metal and the base is provided in a sufficient amount to increase the solubility of the complexing agent by forming a salt thereof.

25. The composition according to claim 23, wherein the base comprises ammonium hydroxide or potassium hydroxide.

26. The composition according to claim 23, wherein the first moiety comprises a peroxide group selected from the group consisting of a peroxycarboxylic acid group, a peroxycarboxylate group, and combinations thereof, the first moiety is reduced to a complexing agent for the metal or oxidized metal, and the resulting complexing agent comprises a carboxylic acid or a carboxylate.

27. The composition according to claim 23, wherein wherein the peroxycarboxylic acid group is selected from the group consisting of peroxyacetic acid, peroxybenzoic acid, chlorobenzoic acid, peroxyformic acid, polyethylene glycol peroxy acid, and combinations thereof, and the second moiety comprises an alkyl group, an alkyl group derivative, an aryl group, an aryl group derivative, or combinations thereof.

28. The composition according to claim 23, wherein the reagent comprises between about 0.005 wt. % and about 25 wt. % of the composition and the stannate salt comprises between about 0.1 ppm and about 20 ppm of the composition.

29. The composition according to claim 23, wherein the stannate salt is selected from the group consisting of sodium stannate, potassium stannate, ammonium stannate, and combinations thereof.

30. The composition according to claim 23, further comprising a corrosion inhibitor selected from the group consisting of benzotriazole, imidazole, benzimidazole, benzothiazole, mercaptobenzotriazole, 5-methyl-1-benzotriazole, and combinations thereof.

31. The composition according to claim 30, wherein the corrosion inhibitor comprises between about 0.005 wt. % and about 0.05 wt. % of the composition.

32. The composition according to claim 23, further comprising abrasive particles at a concentration between about 0.1 wt. % and about 30 wt. % of the composition.

* * * * *